US012000906B2

(12) United States Patent
He et al.

(10) Patent No.: US 12,000,906 B2
(45) Date of Patent: Jun. 4, 2024

(54) SYSTEM AND METHOD FOR MEASURING TRANSFORMER HOT-SPOT TEMPERATURE

(71) Applicant: Shandong University, Jinan (CN)

(72) Inventors: Dongxin He, Jinan (CN); Qingjing Zang, Jinan (CN); Qingquan Li, Jinan (CN); Wenjie Gong, Jinan (CN); Xinyan Feng, Jinan (CN); Han Liu, Jinan (CN)

(73) Assignee: SHANDONG UNIVERSITY, Jinan (CN)

( * ) Notice: Subject to any disclaimer, the term of this patent is extended or adjusted under 35 U.S.C. 154(b) by 0 days.

(21) Appl. No.: 17/459,870

(22) Filed: Aug. 27, 2021

(65) Prior Publication Data

US 2022/0196759 A1    Jun. 23, 2022

(30) Foreign Application Priority Data

Dec. 18, 2020   (CN) .......................... 202011505504.0

(51) Int. Cl.
*G01R 31/62* (2020.01)
*G01K 11/24* (2006.01)
*G01K 13/00* (2021.01)

(52) U.S. Cl.
CPC .............. *G01R 31/62* (2020.01); *G01K 11/24* (2013.01); *G01K 13/00* (2013.01)

(58) Field of Classification Search
CPC ........ G01R 31/62; G01K 11/24; G01K 13/00; G01K 2213/00; G01K 1/14
See application file for complete search history.

(56) References Cited

U.S. PATENT DOCUMENTS

| 8,461,953 B1* | 6/2013 | Ward ...................... F28F 27/00 |
| | | 336/62 |
| 2004/0021449 A1* | 2/2004 | Stenestam .......... G01R 31/3274 |
| | | 324/415 |

FOREIGN PATENT DOCUMENTS

CN     103344934 A   * 10/2013

OTHER PUBLICATIONS

English translation of CN-103344934-A (Year: 2013).*

* cited by examiner

*Primary Examiner* — Giovanni Astacio-Oquendo
*Assistant Examiner* — Haidong Zhang
(74) *Attorney, Agent, or Firm* — Bochner PLLC; Andrew D. Bochner

(57) ABSTRACT

The present disclosure provides a system and a method for measuring hot-spot temperature of a transformer, wherein the measurement system comprises a processor, an oscilloscope and a plurality of ultrasonic sensors, wherein the ultrasonic sensors are oppositely arranged on an outer wall of a transformer oil tank and electrically connected with the oscilloscope, and the oscilloscope is electrically connected with the processor; the ultrasonic sensors receive signals transmitted by the oppositely arranged ultrasonic sensors and transmit them to the oscilloscope. The method, by applying an ultrasonic wave to measure the hot-spot temperature of a transformer in real time, solves the problems that methods in the prior art are susceptible to the external environment, have short service life and cannot correctly measure the internal temperature of the transformer.

9 Claims, 2 Drawing Sheets

SYSTEM AND METHOD FOR MEASURING TRANSFORMER HOT-SPOT TEMPERATURE

CROSS REFERENCE TO RELATED APPLICATION(S)

This patent application claims the benefit and priority of Chinese Patent Application No. 202011505504.0, filed on Dec. 18, 2020, the disclosure of which is incorporated by reference herein in its entirety as part of the present application.

TECHNICAL FIELD

The present disclosure relates to the technical field of transformers, and in particular to a system and a method for measuring transformer hot-spot temperature.

BACKGROUND ART

The description in this section merely provides background technical information related to this disclosure, and do not necessarily constitute a prior art.

A power transformer is one of key devices for a power system, and its reliability is directly associated with whether the power system can operate efficiently, safely and economically. The main reason for the end of service lives of most power transformers is that the winding temperature is too high, which makes the transformers lose their insulation capacity. Therefore, the way of automatic monitoring of the winding temperature of a power transformer is one of the research focuses in China.

The inventor found that, as far as the research in the prior art is concerned, the calculation model given by the standard criterion of calculation methods recommended by the national standard for power transformer winding temperature measurement is simple and easy to operate, but it requires too many assumed conditions, which are quite different from real conditions and produce large errors in complex environments and cases such as sudden load changes. In addition, temperature measurement methods in the prior art include thermal resistance temperature measurement, thermocouple temperature measurement, infrared temperature measurement, and temperature measurement by an optical fiber temperature sensor, which have various defects. Thermal resistance temperature measurement and thermocouple temperature measurement reflect the received measured signals through metal wires. The metal wires are made of metal, and susceptible to corrosion and short circuit, thus making this method difficult to meet the demand. At present, infrared temperature measurement is only used to measure the surface temperature of a transformer oil tank and the outer surface temperature of the transformer, and the measured results are susceptible to the external temperature. The optical fiber temperature sensor is more suitable for measuring the temperature at a position to be measured inside the transformer, which is arranged within a transformer winding stay or a cushion block between winding pies so as to obtain the real-time temperature of the transformer winding. However, this method is only suitable for newly manufactured transformers. Therefore, temperature monitoring methods in the prior art of the power transformer confront problems such as low monitoring accuracy and unreliability, which cannot meet the needs of the modern society.

SUMMARY

In order to solve the above mentioned problems, the present disclosure provides a system and a method for measuring transformer hot-spot temperature so as to, by applying an ultrasonic wave to measure the hot-spot temperature of a transformer in real time, solve the problems that methods in the prior art are susceptible to the external environment, have short service life and cannot correctly measure the internal temperature of the transformer.

In order to achieve the above purpose, the present disclosure provides the following technical scheme:

One or more embodiments provide a system of measuring hot-spot temperature of a transformer, which includes a processor, an oscilloscope and a plurality of ultrasonic sensors, wherein the ultrasonic sensors are oppositely arranged on an outer wall of a transformer oil tank and electrically connected with the oscilloscope, and the oscilloscope is electrically connected with the processor; the ultrasonic sensors receive signals transmitted by the oppositely arranged ultrasonic sensors and transmit them to the oscilloscope.

One or more embodiments provide a method for measuring hot-spot temperature of a transformer, which includes the following steps:

Controlling the transmission of ultrasonic signals to obtain ultrasonic signals passing through the interior of the transformer;

Identifying the ultrasonic signals with changed waveforms among the acquired ultrasonic signals;

According to the position of the arranged ultrasonic sensor, identifying the propagation path of the ultrasonic signals with changed ultrasonic waveforms, and determining the area where multiple paths with changed waveforms overlap with each other is the hot-spot area;

According to the position of the hot-spot area and the ultrasonic signals passing through the area, constructing a solution matrix of the hot-spot area based on a radial basis function to calculate the temperature distribution of the hot-spot area.

An electronic device is provided, including a memory, a processor, and computer instructions stored in the memory and running on the processor, wherein the computer instructions, when executed by the processor, complete the steps described in the above method.

A computer-readable storage medium is provided, used for storing the computer instructions, wherein the computer instructions, when executed by the processor, complete the steps described in the above method.

In comparison to the prior art, the present disclosure has the following beneficial effects:

(1) In this disclosure, ultrasonic sensors are used to monitor the hot-spot temperature of a transformer, which solves the problems that measuring devices are easily damaged by corrosion and measurement interference cannot be get rid of in temperature measurement methods in the prior art. The method in the present disclosure has the advantages of all-weather availability, wide temperature-measuring range, fast response, high sensitivity, safe use and the like, which can improve the maintenance efficiency and operation reliability of the power transformer and reduce the probability of failure and disrepair of the power transformer.

(2) According to the measuring method disclosed by the present disclosure, the temperature distribution in the hot-spot area can be identified by constructing a solution matrix, so that the temperature field in the hot-spot area of the transformer can be effectively visualized, so that the temperature distribution and temperature difference in the hot-spot area can be visually viewed, and in turn the temperature state of the transformer can be detected and controlled. According to the result of real-time monitoring of the transformer winding temperature, the transformer can be adjusted in operation state or overhauled in time to confine the transformer winding temperature within a normal range. The measuring method in the disclosure is simple in principle, which has the advantages such as on-line detection, non-contact and non-interference, wide temperature-measuring range, and high precision, well characterizing the hot spot of the transformer and allowing effective improvement of the transformer service life and the stability and reliability of the power system operation.

BRIEF DESCRIPTION OF THE DRAWINGS

The accompanying drawings of the specification forming a part of the present disclosure are used to help further understand the present disclosure, and illustrative embodiments of the present disclosure and descriptions thereof are used to explain the present disclosure without limiting the present disclosure.

Figure 1:
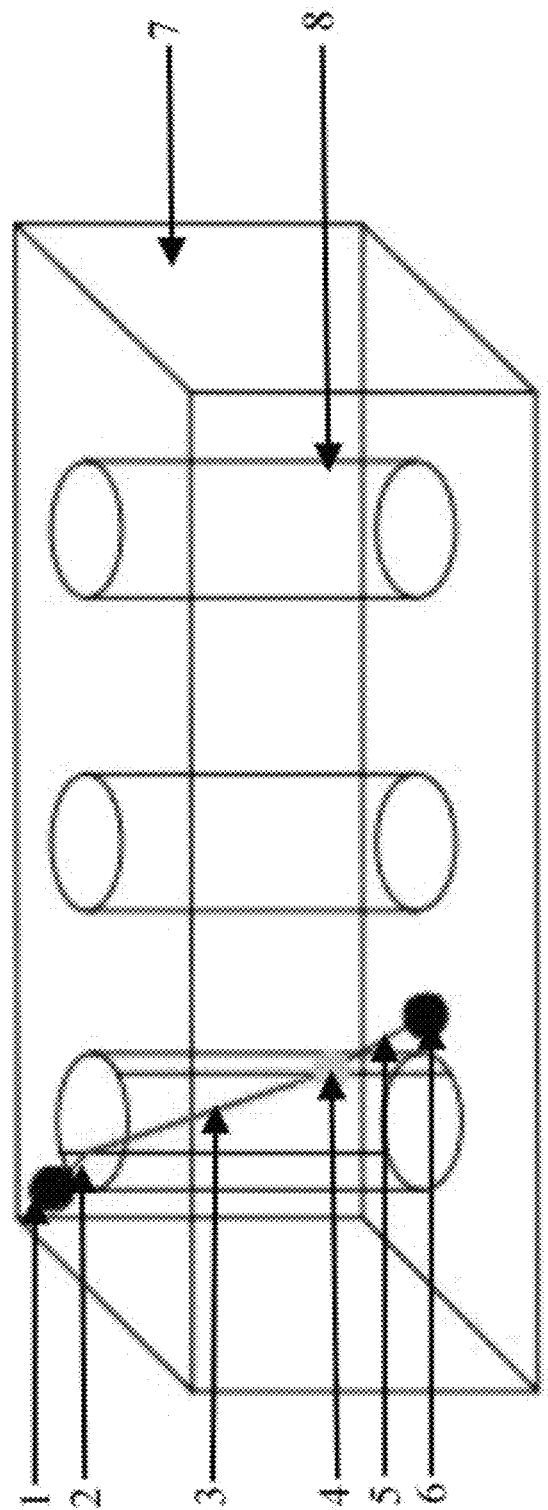
FIG. 1 is a schematic diagram of a system of measuring hot-spot temperature of a transformer according to the Embodiment 1 of the present disclosure.
Figure 2:
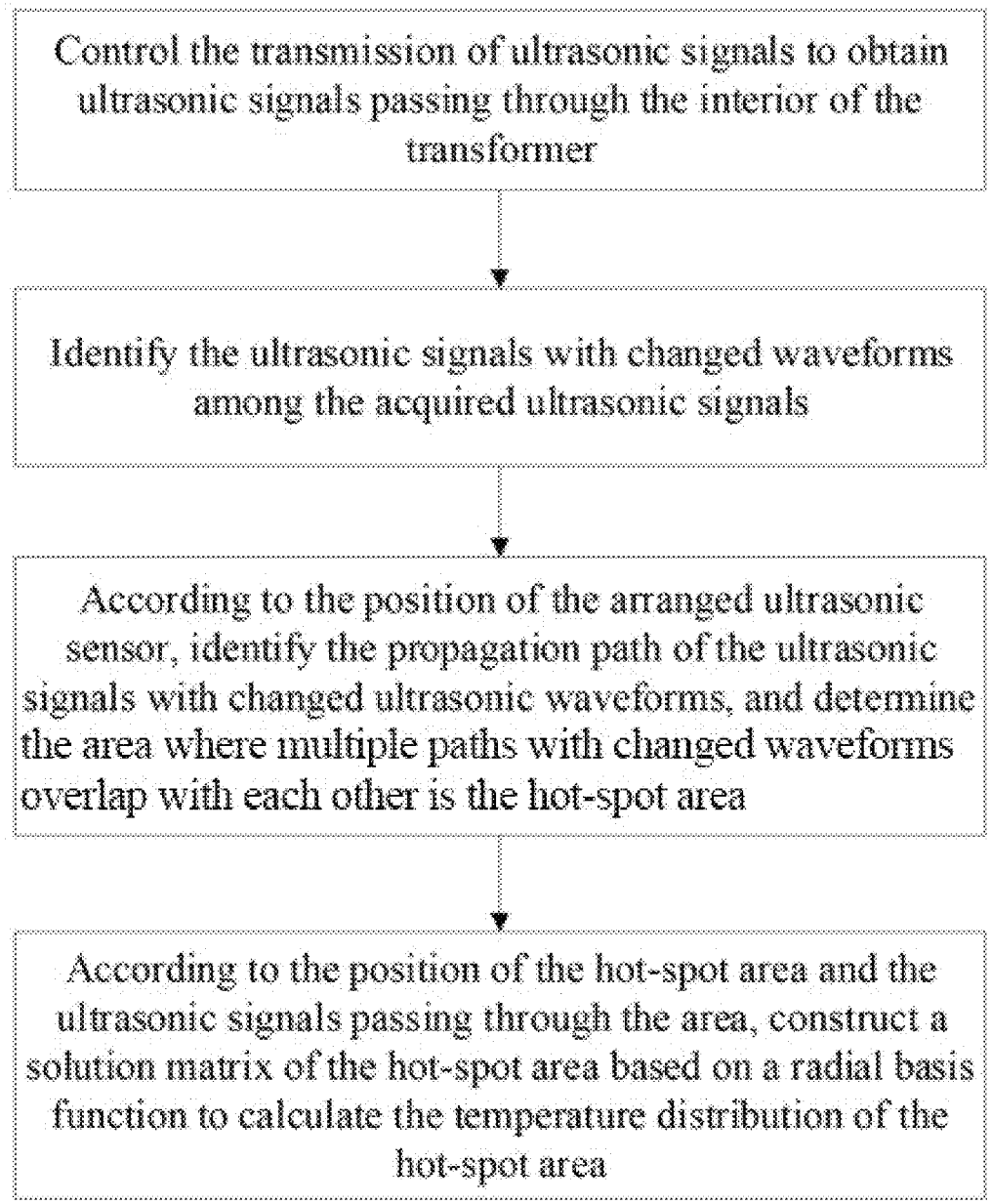
FIG. 2 is a flowchart of a method according to the Embodiment 2 of the present disclosure.

The reference numerals include: 1—first ultrasonic sensor, 2—first transmission path of ultrasonic wave in oil, 3—transmission path of ultrasonic wave in iron core and winding, 4—hot-spot area, 5—second transmission path of ultrasonic wave in oil, 6—second ultrasonic sensor, 7—outer wall of transformer oil tank, 8—transformer winding and iron core.

DETAILED DESCRIPTION OF THE EMBODIMENTS

The present disclosure will be further described with reference to figures and embodiments below.

It should be noted that the following detailed description is only illustrative and aims at providing further description of the present disclosure. Unless otherwise specified, all technical and scientific terms used herein have identical meanings as commonly understood by those of ordinary skill in the art to which this disclosure pertains.

It should be noted that the terms used herein are only for describing specific embodiments without limiting exemplary embodiments according to the present disclosure. As used herein, unless clearly indicated in the context otherwise, the singular form is also intended to include the plural form. In addition, it should also be understood that when the term "include/including" and/or "comprise/comprising" are used in this specification, they indicate the presence of features, steps, operations, devices, components and/or combinations thereof. It should be noted that the embodiments in the present disclosure and the features in the embodiments can be combined with each other without conflict. Embodiments will be further described with reference to accompanying drawings below.

Embodiment 1

Ultrasonic temperature measurement is a kind of acoustic temperature measurement. It adopts non-contact temperature measurement method, and uses the function relationship between the propagation velocity of the ultrasonic wave in solid, liquid, gas and the medium temperature to measure the temperature. In an ideal gas, the propagation velocity of the ultrasonic wave is proportional to the square root of the medium temperature. In most liquids, the propagation velocity of the ultrasonic wave keeps a linear relation with temperature. In general solids, the propagation velocity of the ultrasonic wave decreases with the increasing temperature. By measuring the propagation velocity of the ultrasonic wave in medium, the medium temperature can be measured.

According to the method for measuring the hot spot temperature of the transformer winding in real time by ultrasonic waves, an appropriate number of ultrasonic sensors are arranged on the outer wall of the transformer. A direct wave path between any two ultrasonic sensors can be determined, and the propagation time of a sound wave on the path can be analyzed through the transmission time of the ultrasonic transmitter and the waveform characteristics received by the receiver. The waveform information received by the sensors during the normal operation of the transformer is collected as an information base, which is then compared with a real-time measured signal to find out a sound wave propagation path with a changed waveform. The area where multiple paths with changed waveforms overlap with each other is the hot-spot area. Through multiple paths of the hot spot, the temperature in this area is detected according to the algorithm. The method in the present disclosure has the advantages of all-weather availability, wide temperature-measuring range, fast response, high sensitivity, safe use and the like, which can improve the maintenance efficiency and operation reliability of the power transformer and reduce the probability of failure and disrepair of the power transformer.

The method will be explained by specific examples as below.

In the technical schemes disclosed in one or more embodiments, as shown in FIG. 1, a system of measuring hot-spot temperature of a transformer is provided, which includes an oscilloscope and a plurality of ultrasonic sensors, wherein the ultrasonic sensors are oppositely arranged on an outer wall of a transformer oil tank and electrically connected with the oscilloscope the oscilloscope is electrically connected with the processor; the ultrasonic sensors receive signals transmitted by the oppositely arranged ultrasonic sensors and transmit them to the oscilloscope. The processor processes the data according to the signal transmitted by the oscilloscope, so as to identify the temperature at the hot-spot area of the transformer.

Specifically, the ultrasonic sensors are connected with an oscilloscope through coaxial cables, and the oscilloscope obtains ultrasonic signals received by the ultrasonic sensors;

The way of opposite arrangement of the ultrasonic sensors allows that one of the ultrasonic sensors can receive signals transmitted by an oppositely arranged ultrasonic sensor. Optionally, the way of opposite arrangement may include: arranging a proper number of ultrasonic sensors on each of four sides, upper and lower surfaces of the transformer oil tank wall, the same number of ultrasonic sensors are arranged on each side, and the positions of sensors arranged on the opposite oil tank walls are opposite. The opposite ultrasonic sensors can be sure to receive the signals from the counterpart sensors.

In this embodiment, the ultrasonic sensors are used to monitor the hot-spot temperature of a transformer, which solves the problems that measuring devices are easily damaged by corrosion and measurement interference cannot be get rid of in temperature measurement methods in the prior art. This method has the advantages of all-weather availability, wide temperature-measuring range, fast response, high sensitivity, safe use and the like, which can improve the maintenance efficiency and operation reliability of the power transformer and reduce the probability of failure and disrepair of the power transformer.

Embodiment 2

Based on the measuring system mentioned above, a method for measuring hot-spot temperature of the transformer is provided in this embodiment, which can be implemented in the processor equipped in the measuring system and include the following steps:

Step 1: transmitting ultrasonic signals and acquiring the ultrasonic signals received by the ultrasonic sensors arranged on the outer wall of the transformer oil tank to be measured, namely acquiring the ultrasonic signals passing through the interior of the transformer.

Step 2: identifying the ultrasonic signals with changed waveforms among the acquired ultrasonic signals;

Step 3: according to the position of the arranged ultrasonic sensor, identifying the propagation path of the ultrasonic signals with changed ultrasonic waveforms, and determining the area where multiple paths with changed waveforms overlap with each other is the hot-spot area;

Step 4: according to the position of the hot-spot area and the ultrasonic signals passing through the area, constructing a solution matrix of the hot-spot area based on a radial basis function to calculate the temperature distribution of the hot-spot area.

In this embodiment, the ultrasonic sensors are used to monitor the hot-spot temperature of the transformer, which solves the problems that measuring devices are easily damaged by corrosion and measurement interference cannot be get rid of in temperature measurement methods in the prior art. Besides, the temperature distribution in the hot-spot area can be identified by constructing a solution matrix, so that the temperature field in the hot-spot area of the transformer can be effectively visualized, and in turn the temperature state of the transformer can be detected and controlled. According to the result of real-time monitoring of the transformer winding temperature, the transformer can be adjusted in operation state or overhauled in time to confine the transformer winding temperature within a normal range. The measuring method in the disclosure is simple in principle, which has the advantages such as on-line detection, non-contact and non-interference, and high precision, thus well characterizing the hot spot of the transformer, allowing the maintenance efficiency and the operation reliability of the power transformer, and reducing the failure and disrepair probability of the power transformer.

In Step 1, the specific method for transmitting the ultrasonic signals includes: ultrasonic sensors arranged differently transmit sound waves at different frequencies. It can be effectively distinguished by frequency that a sound wave received by an ultrasonic sensor comes from which sensor, and the time to when the ultrasonic sensors emit the sound waves is taken as the initial reference time.

According to a further technical scheme, the following method can be adopted for reliably receiving the transmitted ultrasonic signals: the sound waves transmitted by the ultrasonic sensors can be improved in intensity, an intensity threshold is specifically set for the transmitted ultrasonic signals, and the intensity of the transmitted ultrasonic signals is controlled to be greater than the set intensity threshold, so that the ultrasonic signals can be effectively collected after attenuation.

In a further technical scheme, an ultrasonic phased array can be used to receive signals, the beam forming is performed after the phase shift, and the synthesized waveform can be analyzed. A reasonable threshold can be established. If the intensity of the waveform exceeds the threshold, it is believed that the ultrasonic wave has been received, and the time $t_1$ is taken as the arrival time. The time difference between arrival time and reference time $(t_1-t_0)$ is the flight time of the ultrasonic wave on this path.

In this embodiment, as shown in FIG. 1, the ultrasonic wave is transmitted by a first ultrasonic sensor 1 at a frequency of 140 kHz and at an emission time of to. When a second ultrasonic sensor 6 receives an ultrasonic wave at a frequency of 140 kHz, it can be determined that the source of the wave is the first ultrasonic sensor 1, and the propagation path of the wave is a sum of a first propagation path 2 of the ultrasonic wave in oil, the propagation path 3 of the ultrasonic wave in iron core and winding, and a second propagation path 5 of the ultrasonic wave in oil. Then, the waveform of the ultrasonic wave at the frequency of 140 kHz received by the second ultrasonic sensor 6 is analyzed. When the amplitude of the waveform exceeds the set threshold, it is regarded that the ultrasonic wave has been received at the time of $t_1$. At this time, it can be determined that the ultrasonic wave propagation path between the first ultrasonic sensor 1 and the second ultrasonic sensor 6 is the sum of the first propagation path 2 of the ultrasonic wave in oil, the propagation path 3 of the ultrasonic wave in iron core and winding, and the second propagation path 5 of the ultrasonic wave in oil, with a flight time being $(t_1-t_0)$. According to this method, the flight time of the ultrasonic wave on any propagation path can be determined.

According to the further technical scheme, the duration of a single transmission of ultrasonic signals is set, and the control of the duration is set according to the duration of a single transmission of signals.

The method of this embodiment solves the problems of serious refraction and reflection of ultrasonic waves inside the transformer and difficulty in determining the propagation path by reasonably setting the duration over which the ultrasonic sensors transmit ultrasonic waves.

If the difference between the time when the ultrasonic sensors receive a certain sound wave and the time when the ultrasonic sensors transmit the sound wave exceeds the sum of the duration of the sound wave transmitted by the ultrasonic sensors and the theoretical flight time of the sound wave on this path, it is regarded that the sound wave is a superimposed wave formed by superimposing multiple paths of sound waves. The signal received at this time is ignored and eliminated in the preprocessing step, which improves the accuracy of temperature identification.

In Step 2, identifying the ultrasonic signals with changed waveforms among the acquired ultrasonic signals, specifically including;

Step 21: acquiring the ultrasonic signals received by various ultrasonic sensors when the transformer is running normally, and establishing a waveform information base;

Step 22: comparing the ultrasonic signals measured in real time with the waveform information stored in the information base, and identifying the ultrasonic signals with changed waveforms among the acquired ultrasonic signals.

In this embodiment, by establishing a waveform information base of ultrasonic waveforms according to historical data of normal operations, the comparison can be realized by controlling parameters of incident ultrasonic signals, so that the ultrasonic waveforms with changed waveforms can be quickly identified. This method is simple and practicable, and may effectively improve the identification efficiency of the system.

In Step 3, according to the position of the arranged ultrasonic sensor, identifying the propagation path of the ultrasonic signals with changed ultrasonic waveforms, which specifically includes;

Step 31: according to the relationship between an ultrasonic propagation velocity and an incident angle, determining incident angles on different medium contact surfaces;

Step 32: according to the incident angle on the medium surface and the installation positions of the transmitting ultrasonic sensors and the receiving sensors, the segmented curves depicting ultrasonic propagation are the propagation curves of ultrasonic signals.

The ultrasonic wave may be refracted when propagating from the transformer oil to the winding and the outer wall of the transformer, vice versa. Its refraction angle is related to the propagation velocity and the incident angle size of the ultrasonic wave in the two media. The relationship between the propagation velocity and the incident angle of the ultrasonic wave is expressed as follows:

$$\sin\theta_1/v_1 = \sin\theta_2/v_2$$

The wave velocities in the oil and in the transformer winding and outer wall are set to the theoretical values: $v_1=1,420$ m/s and $v_2=5,800$ m/s respectively, where $v_1$ is the wave velocity in the transformer oil and $v_2$ is the wave velocity in the transformer winding or the outer wall. Then, according to the installation positions of the ultrasonic sensors on the outer wall of the transformer, the incident angle of the ultrasonic waves when propagating to another medium can be determined. The ultrasonic refraction angle can be calculated by the above formula, and thus the ultrasonic propagation path between any two sensors can be determined.

For example, in FIG. 1, ultrasonic waves transmitted by the ultrasonic sensor 1 will be refracted at the interface between the transformer oil and the transformer winding and iron core 8 when propagating from the oil to the winding and iron core. The ultrasonic propagation path is shown as the first propagation path 2 of the ultrasonic wave in oil and the propagation path 3 of the ultrasonic wave in the winding and iron core in FIG. 1. The relationship between the incident angle and the refraction angle satisfies the above formula. Similarly, the propagation path of the ultrasonic wave propagating from the winding to the transformer oil is as shown by the propagation path 3 of the ultrasonic wave in the winding and the second propagation path 5 of the ultrasonic wave in oil in FIG. 1. Therefore, the ultrasonic sensor 6 receives an ultrasonic wave transmitted from the ultrasonic sensor 1 along a propagation path which is a sum of the first propagation path 2 of the ultrasonic wave in oil, the propagation path 3 of the ultrasonic wave in iron core and winding, and the second propagation path 5 of the ultrasonic wave in oil. According to this method, the propagation path of the ultrasonic wave between any two sensors can be determined.

For the received ultrasonic signals with changed signal waveforms and the corresponding propagation paths of the ultrasonic signals, the area where multiple propagation paths pass through is the hot-spot area.

In Step 4, according to the position of the hot-spot area and the ultrasonic signals passing through the area, constructing a solution matrix of the hot-spot area based on a radial basis function to calculate the temperature distribution of the hot-spot area, which specifically includes:

Step 41: meshing the hot-spot area;

Step 42: according to the relationship between the sound velocity, propagation time and propagation path, building a hot-spot area solution matrix based on a radial basis function;

Step 43: calculating the temperature of each mesh in the hot-spot area by using the singular value decomposition and the interpolation algorithm to obtain the temperature distribution in the hot-spot area.

The specific steps are as follows:

The hot-spot area is meshed into n three-dimensional meshes, and the coordinates of a center point of the $i^{th}$ mesh is expressed as $(x_i, y_i, z_i)$;

In the formula, on any sound wave propagation path $p_k$, a functional relationship between the flight time $g_k$ of the ultrasonic wave and the reciprocal $f(x, y, z)$ of the sound velocity is as follows:

$$g_k = \int_{P_k} f(x,y,z) dp_k, k=1,2,\ldots,m \qquad (1)$$

In the formula, $f(x, y, z)$ is the reciprocal of sound velocity, m is the number of sound wave paths passing through the hot-spot area, and the hot-spot area is meshed into n three-dimensional meshes, and the coordinates of the center point of the $i^{th}$ mesh is expressed as $(x_i, y_i, z_i)$.

The reciprocal $f(x, y, z)$ of sound velocity is discretized into a plurality of linear combinations of n basis functions as follows:

$$f(x, y, z) = \sum_{i=1}^{n} \varepsilon_i \varphi_i(x, y, z) \qquad (2)$$

Wherein $\varepsilon_i$ is an undetermined coefficient and $\varphi_i(x, y, z)$ is the radial basis function:

$$\varphi_i(x, y, z) = e^{-a}\sqrt{(x-x_i)^2 + (y-y_i)^2 + (z-z_i)^2} \qquad (3)$$

Wherein a is the shape parameter of the radial basis function.

The undetermined coefficient $\varepsilon_i$ in formula (2) is solved, and formulas (1), (2) and (3) are combined so that:

$$g_k = \sum_{i=1}^{n} \varepsilon_i \int_{P_k} \varphi_i(x, y, z) dp_k = \sum_{i=1}^{n} \varepsilon_i a_{ki} \qquad (4)$$

Wherein $a_{ki} = \int_{P_k} \varphi_i(x, y, z) dp_k$

Definition: $A=(a_{ki})_{k=1,\ldots,m; i=a,\ldots,n}$; matrix A is the matrix related to the number of ultrasonic paths and meshing.

$$g=(g_1,\ldots,g_k)^T, \varepsilon=(\varepsilon_1,\ldots,\varepsilon_n)$$

So that the formula (4) may be expressed as:

$$g = A\varepsilon \qquad (5)$$

By using a reconstruction matrix A, the solution matrix E of the hot-spot area is solved.

The reconstruction matrix A is decomposed by SVD:

In the formula, $\sigma_1 \geq \sigma_2 \geq \ldots \geq \sigma_\gamma \geq 0$ are $\gamma$ non-zero singular values of the reconstruction matrix A, $\gamma$ is the rank of the reconstruction matrix A, and U and V are eigenvectors whose column vectors are orthogonal matrices $AA^T$ and $A^T A$ respectively.

Therefore, it can be deduced that the pseudo inverse of A is:

$$A^{-1} = V \begin{bmatrix} \sum^{-1} & 0 \\ 0 & 0 \end{bmatrix} U^T, \sum^{-1} = diag\left(\frac{1}{\sigma_1}, \frac{1}{\sigma_2}, \ldots, \frac{1}{\sigma_\gamma}\right)$$

By the singular value decomposition, p is made represent the total number of non-zero singular values, so that the least square solution of formula (5) can be expressed as:

$$\varepsilon = \sum_{i=1}^{p} \frac{u_i^T t}{\sigma_i} v_i$$

Therefore, by solving the coefficient to be determined and substituting its value into formula (2), the sound velocity distribution in the measured area can be obtained. Then the temperature values at center points of n spatial meshes can be obtained. Finally, the interpolation algorithm is used to obtain the detailed temperature distribution.

In this embodiment, a hot-spot area solution matrix is constructed on the basis of a radial basis function, the temperature distribution in the hot-spot area can be identified through this solution matrix, so that the temperature field in the hot-spot area of the transformer can be effectively visualized, so that the temperature distribution and temperature difference in the hot-spot area can be visually viewed, and in turn the temperature state of the transformer can be detected and controlled. According to the result of real-time monitoring of the transformer winding temperature, the transformer can be adjusted in operation state or overhauled in time to confine the transformer winding temperature within a normal range. The measuring method in the disclosure is simple in principle, which has the advantages such as on-line detection, non-contact and non-interference, wide temperature-measuring range, and high precision, well characterizing the hot spot of the transformer and allowing effective improvement of the transformer service life and the stability and reliability of the power system operation.

Embodiment 3

This embodiment provides an electronic device, including a memory, a processor, and computer instructions stored in the memory and running on the processor. When the computer instructions are executed by the processor, they complete the steps described in the method of Embodiment 2.

Embodiment 4

This embodiment provides a computer readable storage medium for storing computer instructions. When the computer instructions are executed by the processor, they complete the steps described in the method of Embodiment 2.

The above description is only a preferred embodiment of the present disclosure without limiting the scope of the present disclosure. For those skilled in the art, various modifications and changes may be performed to the present disclosure. Any modification, equivalent replacement, improvement and the like falling within the spirit and principle scope of the present disclosure shall be included in the protection scope of the present disclosure.

Although the specific embodiments of this disclosure have been described with reference to the accompanying drawings, it is not a limitation on the protection scope of this disclosure. Those skilled in the art should know that, based on the schemes provided in the present disclosure, various modifications or variations that can be made by those skilled in the art without creative labor are still within the protection scope of this disclosure.

What is claimed is:

1. A system of measuring a temperature of a transformer, comprising: a processor, an oscilloscope and a plurality of ultrasonic sensors, wherein the plurality of ultrasonic sensors are oppositely arranged on outer walls of a transformer oil tank and electrically connected with the oscilloscope, and the oscilloscope is electrically connected with the processor; one ultrasonic sensor of the plurality of ultrasonic sensors receives signals transmitted by an oppositely arranged ultrasonic sensor of the plurality of ultrasonic sensors, and the one ultrasonic sensor transmits the signals received from the oppositely arranged ultrasonic sensor to the oscilloscope.

2. A method for maintaining a transformer, comprising:
controlling transmission of ultrasonic signals generated by ultrasonic sensors to obtain ultrasonic signals passing through an interior of the transformer;
identifying ultrasonic signals with changed waveforms among obtained ultrasonic signals;
according to positions of the ultrasonic sensors, identifying propagation paths of ultrasonic signals with changed ultrasonic waveforms, and determining an area where multiple propagation paths with changed ultrasonic waveforms overlap with each other;
according to a position of the area and ultrasonic signals passing through the area, constructing a solution matrix of the area based on a radial basis function to calculate a temperature distribution of the area;
adjusting or overhauling the transformer based on the temperature distribution of the area,
wherein
the step of according to the position of the area and the ultrasonic signals passing through the area, constructing the solution matrix of the area based on the radial basis function to calculate the temperature distribution of the area, comprises:
meshing the area into n three-dimensional meshes, a coordinate of a center point of an ith mesh of the n three-dimensional meshes being presented as $(x_i, y_i, z_i)$ wherein n is an integer and i is an integer;
building an area solution matrix based on a radial basis function according to a functional relationship between a sound velocity, a flight time and a sound wave propagation path, wherein the functional relationship is $$g_k = \int_{p_k} f(x,y,z) dp_k, k=1,2,\ldots,m \quad (1)$$

where the sound wave propagation path $p_k$, the flight time $g_k$ and a reciprocal f(x, y, z) of the sound velocity, a number m of sound wave paths passing through the area; the reciprocal f(x, y, z) is discretized into a plurality of linear combinations of n basis functions as follows:

$$f(x, y, z) = \sum_{i=1}^{n} \varepsilon_i \varphi_i(x, y, z), \quad (2)$$

wherein $\varepsilon_i$ is an undetermined coefficient and $\varphi_i(x, y, z)$ is a radial basis function:

$$\varphi_i(x, y, z) = e^{-a\sqrt{(x-x_i)^2+(y-y_i)^2+(z-z_i)^2}}, \quad (3)$$

wherein a is a shape parameter of the radial basis function; the undetermined coefficient $\varepsilon_i$ in formula (2) is solved, and formulas (1), (2) and (3) are combined as follows:

$$g_k = \sum_{i=1}^{n} \varepsilon_i \int_{p_k} \varphi_i(x, y, z)dp_k = \sum_{i=1}^{n} \varepsilon_i a_{ki}, \quad (4)$$

where $a_{ki}=\int_{p_k}\varphi_i(x, y, z)dp_k$; a solution matrix of the area is built as a matrix $A=(a_{ki})_{k=1,\ldots,m;i=a,\ldots,n}$; g and $\varepsilon$ are defined as $g=(g_1, \ldots, g_k)^T$, $\varepsilon=(\varepsilon_1, \ldots, \varepsilon_n)$, and the formula (4) is expressed as:

$$g=A\varepsilon \quad (5);$$

the solution matrix of the area is solved by reconstructing the matrix A; and obtaining the temperature distribution in the area, based on the area solution matrix, using a singular value decomposition (SVD) and an interpolation algorithm, wherein a reconstructed matrix is decomposed by SVD; a pseudo inverse of the matrix A is:

$$A^{-1} = V\begin{bmatrix}\Sigma^{-1} & 0 \\ 0 & 0\end{bmatrix}U^T, \Sigma^{-1} = \text{diag}\left(\frac{1}{\sigma_1}, \frac{1}{\sigma_2}, \ldots, \frac{1}{\sigma_\gamma}\right),$$

where $\sigma_1 \geq \sigma_2 \geq \ldots \geq \sigma_\gamma \geq 0$ are $\gamma$ non-zero singular values of the reconstructed matrix, $\gamma$ is a rank of the reconstructed matrix, and U and V are eigenvectors whose column vectors are orthogonal matrices $AA^T$ and $A^TA$ respectively; by the singular value decomposition, a least square solution of formula (5) can be expressed as:

$$\varepsilon = \sum_{i=1}^{p} \frac{u_1^T t}{\sigma_i} v_i,$$

where p represents a total number of non-zero singular values.

3. The method according to claim 2, comprising: transmitting ultrasonic signals, which includes: the ultrasonic sensors are arranged differently transmit sound waves at different frequencies;

alternatively, an intensity threshold is set for the transmitted ultrasonic signals, and an intensity of the transmitted ultrasonic signals is controlled to be greater than the set intensity threshold;

alternatively, a duration of a single transmission of the ultrasonic signals is set, and a control of the duration is set according to the duration of the single transmission of the ultrasonic signals;

alternatively, an ultrasonic phased array is used to receive the ultrasonic signals, a beam forming is performed after a phase shift, and a synthesized waveform can be analyzed; a threshold can be established, and when an intensity of the synthesized waveform exceeds the threshold, it is determined that the ultrasonic signals have been received.

4. The method according to claim 2, wherein the step of identifying the ultrasonic signals with changed waveforms among the acquired ultrasonic signals, includes:

Step 21: acquiring the ultrasonic signals received by various ultrasonic sensors when the transformer is running, and establishing a waveform information base;

Step 22: comparing the ultrasonic signals measured in real time with waveform information stored in the waveform information base, and identifying the ultrasonic signals with changed waveforms among the acquired ultrasonic signals.

5. The method according to claim 2, comprising:

according to the positions of the arranged ultrasonic sensors, identifying the propagation paths of the ultrasonic signals with changed ultrasonic waveforms;

according to a relationship between an ultrasonic propagation velocity and an incident angle, determining incident angles on different medium contact surfaces;

according to the incident angles on the medium contact surfaces and positions of transmitting ultrasonic sensors and receiving ultrasonic sensors, segmented curves depicting ultrasonic propagation are propagation curves of the ultrasonic signals.

6. An electronic device, comprising a memory, a processor, and computer instructions stored in the memory and running on the processor, wherein the computer instructions, when executed by the processor, complete the steps described according to claim 2.

7. The electronic device according to claim 6, comprising:

transmitting ultrasonic signals, which includes: the ultrasonic sensors are arranged differently transmit sound waves at different frequencies;

alternatively, an intensity threshold is set for the transmitted ultrasonic signals, and an intensity of the transmitted ultrasonic signals is controlled to be greater than the set intensity threshold;

alternatively, a duration of a single transmission of the ultrasonic signals is set, and a control of the duration is set according to the duration of the single transmission of the ultrasonic signals;

alternatively, an ultrasonic phased array is used to receive the ultrasonic signals, a beam forming is performed after a phase shift, and a synthesized waveform can be analyzed; a threshold can be established, and when an intensity of the synthesized waveform exceeds the threshold, it is determined that the ultrasonic signals have been received.

8. The electronic device according to claim 6, comprising:

identifying the ultrasonic signals with changed waveforms among the acquired ultrasonic signals, which includes:

Step 21: acquiring the ultrasonic signals received by various ultrasonic sensors when the transformer is running, and establishing a waveform information base;

Step 22: comparing the ultrasonic signals measured in real time with waveform information stored in the waveform information base, and identifying the ultrasonic signals with changed waveforms among the acquired ultrasonic signals.

9. The electronic device according to claim 6, comprising:
according to positions of the arranged ultrasonic sensors, identifying the propagation paths of the ultrasonic signals with changed ultrasonic waveforms;
according to a relationship between an ultrasonic propagation velocity and an incident angle, determining incident angles on different medium contact surfaces;
according to the incident angles on the medium contact surfaces and the positions of transmitting ultrasonic sensors and receiving ultrasonic sensors, segmented curves depicting ultrasonic propagation are propagation curves of the ultrasonic signals.

\* \* \* \* \*